United States Patent
Yang et al.

(10) Patent No.: US 10,475,510 B2
(45) Date of Patent: Nov. 12, 2019

(54) LEAKAGE COMPENSATION READ METHOD FOR MEMORY DEVICE

(71) Applicant: MACRONIX INTERNATIONAL CO., LTD., Hsinchu (TW)

(72) Inventors: Shang-Chi Yang, Changhua (TW); Chun-Yu Liao, Taichung (TW); Ken-Hui Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 57 days.

(21) Appl. No.: 15/850,280

(22) Filed: Dec. 21, 2017

(65) Prior Publication Data

US 2019/0198098 A1 Jun. 27, 2019

(51) Int. Cl.
*G11C 13/00* (2006.01)
*G11C 11/16* (2006.01)
*G11C 27/02* (2006.01)

(52) U.S. Cl.
CPC ........ *G11C 13/004* (2013.01); *G11C 11/1673* (2013.01); *G11C 13/0026* (2013.01); *G11C 13/0033* (2013.01); *G11C 13/0038* (2013.01); *G11C 13/0004* (2013.01); *G11C 27/024* (2013.01); *G11C 2013/0042* (2013.01); *G11C 2013/0045* (2013.01); *G11C 2013/0054* (2013.01); *G11C 2013/0057* (2013.01)

(58) Field of Classification Search
CPC .............. G11C 13/004; G11C 13/0042; G11C 13/0045; G11C 13/0057; G11C 2013/0042; G11C 2013/0045; G11C 2013/0057

See application file for complete search history.

(56) References Cited

U.S. PATENT DOCUMENTS

| | | | |
|---|---|---|---|
| 6,052,307 A * | 4/2000 | Huber | G11C 7/14 327/52 |
| 6,579,760 B1 | 6/2003 | Lung | |
| 7,245,526 B2 | 7/2007 | Oh et al. | |
| 7,248,494 B2 | 7/2007 | Oh et al. | |
| 7,324,370 B2 | 1/2008 | Smith et al. | |
| 7,701,763 B2 | 4/2010 | Roohparvar | |
| 7,876,618 B2 | 1/2011 | Lee et al. | |

(Continued)

FOREIGN PATENT DOCUMENTS

WO 2014047119 A1 3/2014

*Primary Examiner* — Huan Hoang
*Assistant Examiner* — Jay W. Radke
(74) *Attorney, Agent, or Firm* — Haynes Beffel & Wolfeld LLP (57) ABSTRACT

A memory device including an array of memory cells including bit lines, and biasing circuitry cells. A sense amplifier has a data line input connected to a data line, and a reference input. The controllable reference current source can be connected to the reference input of the sense amplifier. Control circuits on the device are configured to cause execution of a read operation, where the read operation includes a first phase in which the array is biased to induce leakage current on the selected bit line, and a second phase in which the array is biased to read a selected memory cell on the selected bit line. A circuit on the device is configured to sample the leakage current in the first phase, and to control the controllable reference current source during the second phase, as a function of the sampled leakage current.

11 Claims, 6 Drawing Sheets

(56) References Cited

U.S. PATENT DOCUMENTS

| | | | |
|---|---|---|---|
| 8,310,858 B2 | 11/2012 | Ito | |
| 9,123,430 B2 | 9/2015 | Cernea | |
| 2012/0120732 A1 | 5/2012 | Lee et al. | |
| 2015/0340087 A1* | 11/2015 | Takahash | G11C 13/004 365/148 |
| 2016/0125937 A1* | 5/2016 | Kang | G11C 13/004 365/148 |

* cited by examiner

LEAKAGE COMPENSATION READ METHOD FOR MEMORY DEVICE

BACKGROUND

Field

The present invention relates to integrated circuit memory, and more specifically to technology for accurately sensing data stored in large-scale memory arrays.

Description of Related Art

The size of memory arrays in integrated circuit memory devices has been steadily increasing. As a result, a single bit line in a large-scale memory array can be coupled with a very large number of individual memory cells. During sensing of data from a selected memory cell, unselected memory cells coupled to the bit line can contribute leakage current that can interfere with the operation of the sensing circuitry. As the number of unselected memory cells increases, the contributions of leakage current adds up and reduces the sensing margin available for the array.

One type of memory array in which this problem is encountered includes programmable resistance memory devices with a high density array of cells organized in a cross-point architecture, such as described in U.S. Pat. No. 6,579,760, entitled SELF-ALIGNED, PROGRAMMABLE PHASE CHANGE MEMORY, issued 17 Jun. 2003, by Lung. Cross-point architectures with memory cells that include a phase change memory element in series with an ovonic threshold switch have been developed as well. Other architectures are utilized, including a variety of 2-dimensional and 3-dimensional array structures. Even in an off state, programmable resistive memory cells can conduct small amounts of leakage current that adds up. Thus, compensation for the leakage current in such devices has been explored. See, U.S. Pat. No. 7,245,526, entitled PHASE CHANGE MEMORY DEVICE PROVIDING COMPENSATION FOR LEAKAGE CURRENT, issued 17 Jul. 2007, by Oh et al.

Similar leakage current problems arise in other memory architectures, including for example NOR flash architectures.

It is desirable to provide technology that can compensate for this leakage effect, and improve the read margin in high density memory arrays.

SUMMARY

A technology is described to compensate for leakage current from unselected memory cells suitable for use in high density memory, including cross-point memory arrays. Utilizing the technology described herein, loss of read margin arising from leakage current can be reduced.

A memory device described herein comprises an array of memory cells including bit lines, and biasing circuitry to apply bias arrangements to the array of memory cells. A sense amplifier has a data line input connected to a data line, and a reference input. A column decoder is coupled to bit lines in the array, and connects selected bit lines to the data line. A data line load circuit is connected to the data line and utilized in connection with the biasing arrangements. A controllable reference current source has a control input, and can be connected to the reference input of the sense amplifier. Control circuits on the device are configured to cause execution of a read operation, where the read operation includes a first, or leakage sampling, phase in which the array is biased to induce leakage current on the selected bit line, and a second, or sensing, phase in which the array is biased to read a selected memory cell on the selected bit line. A circuit on the device is configured to sample the leakage current in the first phase, and provide a control signal to the control input of the controllable reference current source during the second phase where the control signal is produced as a function of the sampled leakage current.

An embodiment is described in which the circuit to sample the leakage current comprises a current mirror circuit coupled to the data line load circuit. The current mirror circuit in this embodiment generates a sample current, that can be isolated from, but a function of, the current in the data line load circuit. A capacitor is connected to be charged by the sample current during the first phase of the read operation. The capacitor is connected to provide the control signal to the controllable reference current source during the sensing phase.

An embodiment of the memory device is described in which the data line load circuit includes a first branch enabled during the first phase of the read operation, and a second branch enabled during the second phase. The circuit to sample the leakage current is connected to the second branch of the data line load circuit. In an embodiment including the first and second branches of the data line load circuit, the circuit to sample the leakage current can comprise a current mirror circuit coupled to the first branch of the data line load circuit, which generates a sample current based on the leakage current. A capacitor and a switch are included. The switch is configured to connect the capacitor to sample current during the first phase, and to connect the capacitor to provide the control signal during the second phase. As a result, data can be sensed based on the read current during the second phase of the operation, utilizing the compensation current produced in a manner that is isolated from the read current.

Isolation from the read current can be accomplished in a variety of manners, examples described herein including using one or more of current mirror circuits, a data line load circuit having two branches, and application of the compensation current to the reference input of the sense amplifier, rather than the data line input.

In general, a method for sensing data is described that comprises selecting a memory cell coupled to a selected bit line, and biasing the memory array to induce leakage current through the memory cells on the selected bit line, including the selected memory cell. The method includes sampling the leakage current, and thereafter biasing the memory array to induce read current through the selected memory cell. The method includes generating a leakage compensation current isolated from the read current in response to the sampled leakage current, and sensing data based on the read current and the compensation current.

As a result of the technology described herein, high density integrated circuit memory devices with improved read margin can be achieved.

Other aspects and advantages of the present invention can be seen on review of the drawings, the detailed description and the claims, which follow.

DETAILED DESCRIPTION

A detailed description of embodiments of the present invention is provided with reference to the FIGS. 1-6.

Figure 1:
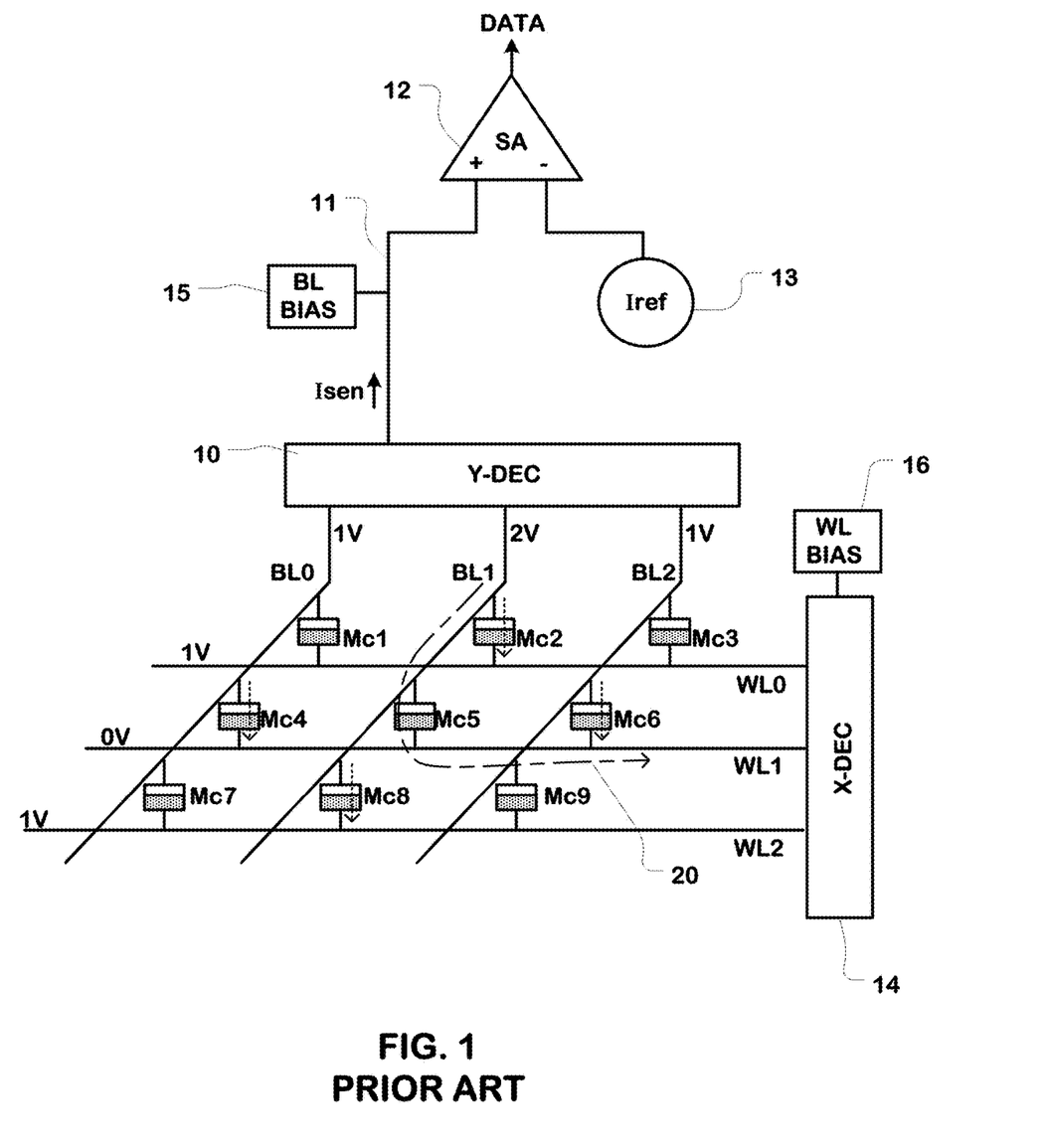
FIG. 1 is a simplified diagram of a level of a cross-point memory array with sensing circuits as known in the prior art.

FIG. 1 illustrates a representative portion of a prior art memory array, such as a level in a 3D cross-point array. The illustrated portion of the memory array includes a plurality of memory cells, including in the illustrated example memory cells Mc1 to Mc9.

The memory array includes a plurality of bit lines, including in the illustrated example, bit lines BL0 to BL2. Likewise, the memory cell array includes a plurality of word lines, including in the illustrated example, word lines WL0 to WL2. Of course, the number of memory cells, bit lines and word lines can be much higher in practical memory devices.

The memory cells Mc1, Mc4 and Mc7 are coupled to a bit line BL0, and disposed at the cross-points of bit line BL0 with the plurality of word lines WL0 to WL2.

The memory cells Mc2, Mc5 and Mc8 are coupled to a bit line BL1, and disposed at the cross-points of bit line BL1 with the plurality of word lines WL0 to WL2.

The memory cells Mc3, Mc6 and Mc9 are coupled to a bit line BL2, and disposed at the cross-points of bit line BL2 with the plurality of word lines WL0 to WL2.

The bit lines BL0 to BL2 are coupled to a column decoder (Y-DEC) 10 that is configured to connect a selected bit line to a data line 11 in response to decoded addresses (not shown).

The sense amplifier 12 has a "+" input connected to the data line 11. The sense amplifier 12 has a "−" input connected to a reference current source Iref 13.

The word lines WL0 to WL2 are coupled to a row decoder (X-DEC) 14 that is configured to apply bias voltages to the word lines in response to decoded addresses.

A bit line bias circuit 15 is coupled to the data line 11, in this example, and configured to apply bias voltages under control of a state machine or other controller on the memory device for the various operating modes, including a read mode.

A word line bias circuit 16 is coupled to the row decoder 14 in this example, and configured to apply bias voltages that are driven on the word lines under control of the state machine or other controller on the memory device for the various operating modes, including the read mode.

The problem of leakage current can be understood with reference to a bias arrangement applied to read a selected memory cell. Thus, a bias arrangement (not admitted to be prior art because of its depiction here) configured to read memory cell Mc5 is illustrated, in which 2 V is applied to the selected bit line BL1, and 0 V is applied to the selected word line WL1. The unselected bit lines BL0 and BL2 are biased at 1 V. The unselected word lines WL0 and WL2 are biased at 1 V.

As can be seen, 2 V is applied across the selected memory cell, which is sufficient to turn on the memory cell and allow current flow on the current path 20 along bit line BL1 and word line WL1, from which the data is stored can be sensed.

This read bias arrangement results in 1 V being applied to both terminals of memory cells Mc1, Mc3, Mc7 and Mc9. As a result, there should be no voltage difference across the cell and no leakage current.

However, this read bias arrangement results in 2 V on bit line BL1 and 1 V on word line WL0 which induces a voltage difference of 1 V across memory cell Mc2. Also, this read bias arrangement results in 2 V on bit line BL1 and 1 V on word line WL2 which induces a voltage difference of 1 V across memory cell Mc8. Although the 1 V difference across the memory cell is below threshold, nonetheless, some leakage current can be induced that can contribute to the current on the current path 20.

Furthermore, this read bias arrangement results in 1 V being applied to bit lines BL0 and BL2, while 0 V is applied to word line WL1. This induces a voltage difference of 1 V across memory cells Mc4 and Mc6 that can contribute to current on the current path 20 used for sensing the data in memory cell Mc5. The magnitude of the leakage current in memory cells Mc4 and Mc6 that is contributed to the current path 20 may be smaller than that contributed by leakage current in memory cells Mc2 and Mc8.

The magnitude of the leakage current is a function of the number of memory cells along the current path 20 of sensing current for the selected memory cell. In a large array, there may be hundreds or thousands of memory cells along this current path.

Also, in some types of memory, the magnitude of the leakage current is a function of the data values stored in the memory cells along the current path, which can impact the magnitude of the leakage current generated by each cell.

This variation in the magnitude of the leakage current for the sensing of a given cell can be encountered from cell to cell across the array, as well as from time to time when sensing the same cell.

The sense amplifier 12 can comprise a variety of circuit structures to detect the difference between the reference current Iref from the current source 13, and the memory cell sensing current Isen on the data line 11. When the magnitude of the sensing current can vary as a result of leakage, the headroom or sensing margin available to the sense amplifier 12 is reduced because the reference current has to be set at a level that can accommodate large variations. In extreme cases, the sense amplifier may not be able to reliably sense the data in selected memory cells.

Figure 2:
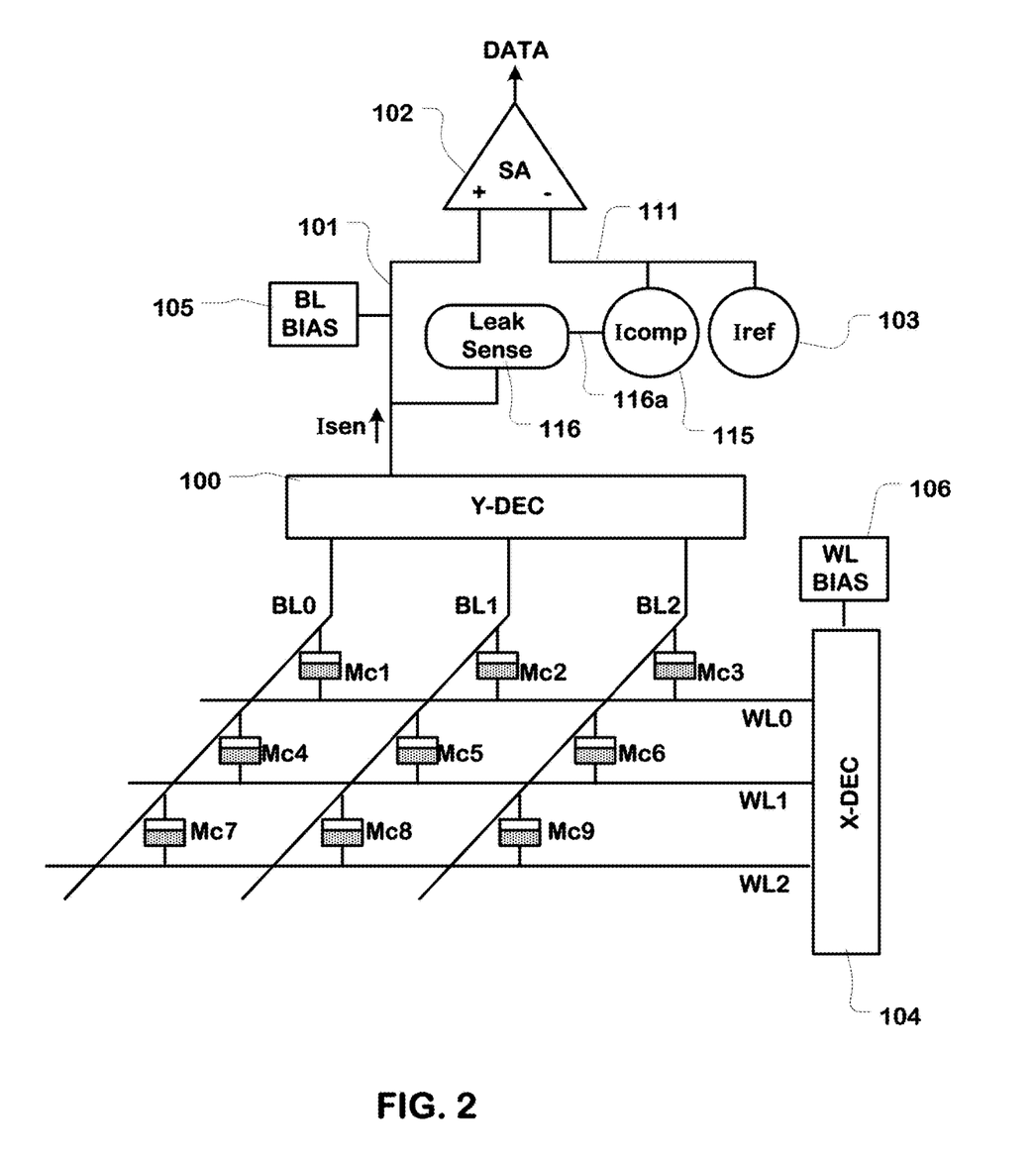
FIG. 2 is a simplified diagram of a level of a cross-point memory array including leakage compensation as described herein.

FIG. 2 illustrates an improved memory device including compensation for leakage current in the sensing operation. As in FIG. 1, FIG. 2 illustrates a representative portion of a cross-point memory array. The memory array includes a plurality of memory cells, including in the illustrated example memory cells Mc1 to Mc9.

The memory array includes a plurality of bit lines, including in the illustrated example, bit lines BL0 to BL2. Likewise, the memory cell array includes a plurality of word lines, including in the illustrated example, word lines WL0 to WL2. Of course, the number of memory cells, bit lines and word lines can be much higher in practical memory devices.

The memory cells Mc1, Mc4 and Mc7 are coupled to a bit line BL0, and disposed at the cross-points of bit line BL0 with the plurality of word lines WL0 to WL2.

The memory cells Mc2, Mc5 and Mc8 are coupled to a bit line BL1, and disposed at the cross-points of bit line BL1 with the plurality of word lines WL0 to WL2.

The memory cells Mc3, Mc6 and Mc9 are coupled to a bit line BL2, and disposed at the cross-points of bit line BL2 with the plurality of word lines WL0 to WL2.

The bit lines BL0 to BL2 are coupled to a column decoder (Y-DEC) 100 that is configured to connect a selected bit line to a data line 101 in response to decoded addresses (not shown).

The word lines WL0 to WL2 are coupled to a row decoder (X-DEC) 104 that is configured to apply bias voltages to the word lines in response to decoded addresses.

A bit line bias circuit 105 is coupled to the data line 101 in this example, and configured to apply bias voltages under control of a state machine or other controller on the memory device for the various operations, including a read operation.

A word line bias circuit 106 is coupled to the row decoder 104 in this example, and configured to apply bias voltages that are driven on the word lines under control of the state machine or other controller on the memory device for the various operations, including during a read operation.

The sense amplifier 102 has a "+" input connected to the data line 101. The sense amplifier 102 has a "−" input connected to a controllable reference current source, which in this example includes a compensation current source 115 which produces a current Icomp, and a constant reference current source 103 which produces a current Iref.

The combination of the current Icomp and Iref is applied a reference line 111 connected to the "−" input of the sense amplifier 102, and is produced as a function of leakage current.

A leak sensing circuit 116 is connected to the data line 101 in this example. The leak sensing circuit 116 generates a control signal on line 116a, which is connected to the compensation current source 115. As a result, the controllable current source which is connected to the reference line on the "−" input side of the sense amplifier can produce a reference current that is a function of leakage current sensed on the current path of the selected memory cell.

Control circuitry on the device is configured to cause execution of a read operation, including a first, or leakage sampling, phase in which the array is biased to induce leakage current on the selected bit line, and a second, or sensing, phase in which the array is biased to read a selected memory cell on the selected bit line.

The biasing during the leakage sampling phase can for example include applying 1 V to the bit lines BL0 and BL2, 2 V to BL1, while applying 1 V to all the word lines WL0, WL1 and WL2. In this way, the memory cells along the selected bit line BL1 that can contribute leakage current to the current path of the sensed memory cell will encounter a below threshold voltage difference (1 V across each of the memory cells Mc2 and Mc8 in the example described) across their terminals in the leakage sensing phase that is the same voltage difference, or similar to the same voltage difference, as the voltage difference to be encountered during the read phase of the operation. The selected memory cell Mc5 can also be biased with the same below threshold voltage difference, as if it were also an unselected cell.

In other embodiments, the leakage bias arrangement can be configured to apply below threshold voltage differences across memory cells along the selected word line WL1 as well as memory cells along the selected bit line.

Leakage current induced as a result of this leakage sampling bias arrangement will be combined and delivered on the data line as Isen during the leakage sampling phase. The leak sensing circuit 116 will sample leakage current, and hold a value for use during the sensing phase of the read operation. This value will be used to provide the control signal to the compensation current source 115 that controls the magnitude of Icomp, and thereby a controllable magnitude of the current on the reference line 111 during the sensing phase.

The leak sensing circuit 116 is operable during the first phase to sample leakage current, and provide a control signal during the second phase to the control input of the controllable reference current source as a function of the sample leakage current.

The compensation current Icomp is produced in a manner that is isolated from the data line during the sensing phase of the read operation. This enables more precise control of the compensation current.

For the purposes of explanation, consider that under this leakage bias condition, the current Isen on the data line can be approximated at 3*Ileak, where Ileak is the leakage current contributed by each of the memory cells Mc2, Mc5, Mc8. The compensation current generated for the simplified example of the nine memory cell array shown in FIG. 2, as a result of sensing, can be tuned so that Icomp is equal to 2/3*Isen (i.e. the ratio of Icomp to Isen is 2/3) in order to compensate for leakage in two unselected memory cells out of the three memory cells along the bit line of the selected memory cell.

As the array size increases, the ratio of Icomp to Isen during the leakage bias condition approaches one. For example, in a 1K by 1K array including 1024 memory cells coupled to a single bit line, the Icomp becomes 1023/1024*Isen.

Of course the absolute magnitude of Icomp can be tuned, based on the number of leakage cells encountered on the current path of the selected memory cell and, in addition, according to characteristics of the circuit implementation of the sense amplifier and other components of the device.

In FIG. 2, the memory cells can include phase change memory cells that comprise, in the illustrated example, a phase change memory element and an ovonic threshold switch in series at each of the cross-points. Other types of memory cells implemented in an array architecture like that shown in FIG. 2 can be utilized in other embodiments, including NOR architecture flash memory devices.

The bias circuits 105, 106 can include a variety of types of circuitry, including regulated voltage supply circuits, charge pumps, voltage dividers, and so on, that are used in cooperation with the circuitry in the decoders and the sense amplifiers according to a variety of configurations utilized in the art, and adapted to the particular implementation of the memory array and sense amplifier.

As mentioned above, the components of FIG. 2 are operated under control of a control circuit, such as a state machine, which drives a read operation according to the leakage sampling phase and the sensing phase. The basic operation performed by the control circuitry is to bias the target cell and surrounding cells in a de-selected bias condition to induce leakage current approximating the leakage current that would be encountered during reading of the target cell. The leakage current is sensed in a next stage. A measure of the leakage current is stored. A compensation current is generated according to the measured leakage current. The compensation current is added to the reference current to be utilized during sensing of the memory cell. The target cell is then biased under a selected cell bias condition for a read operation. Then, the sensing operation is enabled.

Figure 3:
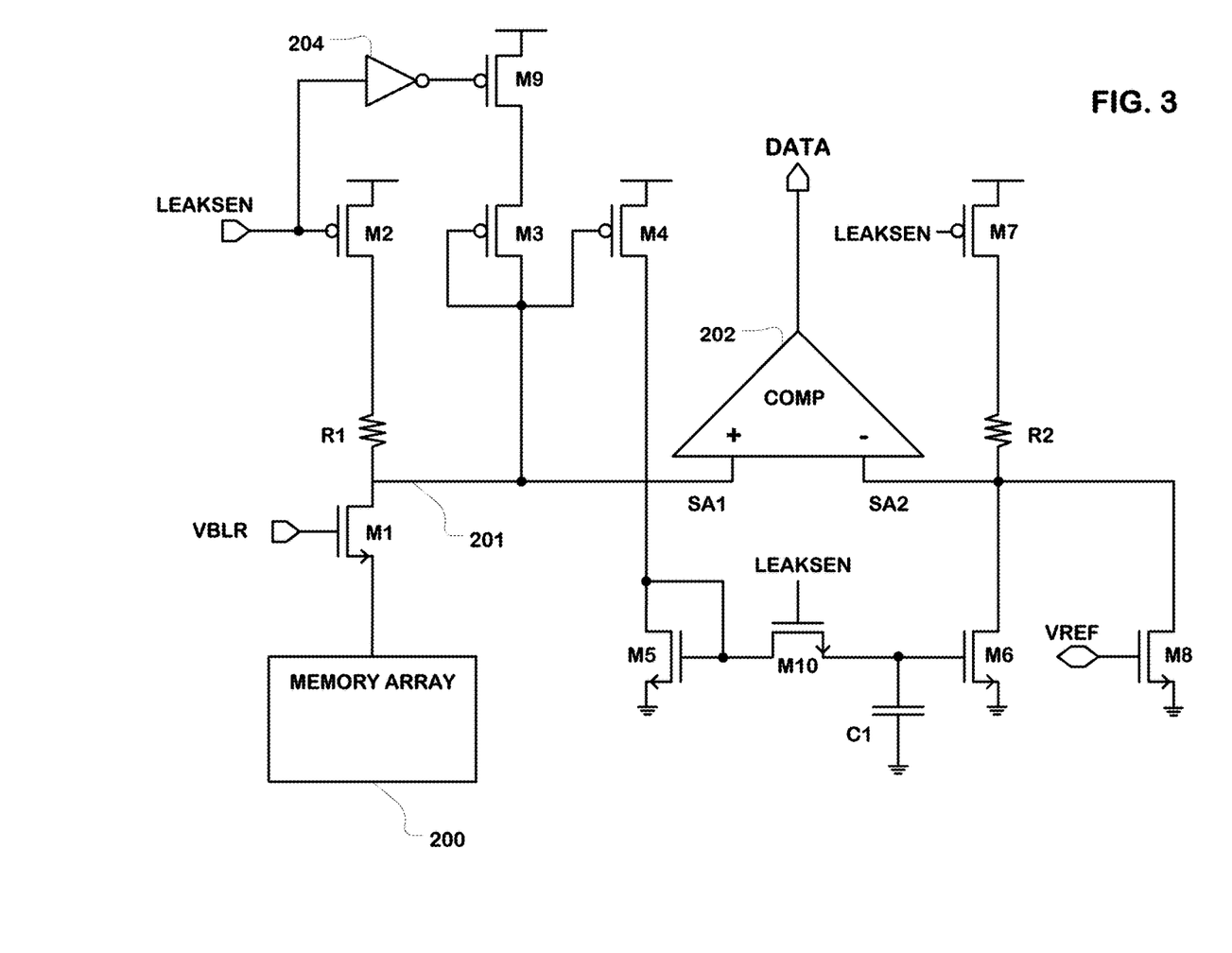
FIG. 3 is a schematic circuit diagram showing an embodiment of leakage compensation technology as described herein.

FIG. 3 is a schematic diagram of one example of circuitry which can be implemented in a system like that of FIG. 2. The schematic in FIG. 3 includes a memory array 200, a comparator 202 configured as a sense amplifier, and a data line 201 which connects the "+" input of the comparator 202 to the memory array 200 through a bit line clamp transistor M1 and column decoder (not shown).

A control signal LEAKSEN is applied to the circuit as illustrated to set the operation of the circuitry in the leakage sampling mode and the sensing mode.

A data line load circuit includes p-type transistors M2, M3 and M9.

A circuit to sample leakage current includes p-type transistor M4, n-type transistor M5, switch transistor M10 and capacitor C1.

A controllable reference current source which is connected to the "−" input of the comparator 202, includes p-type transistor M7, n-type transistor M6 and n-type transistor M8.

The LEAKSEN signal is applied to the gates of transistors M2, M7 and M10, and to inverter 204 which produces the complement of the LEAKSEN signal, which in turn is applied to the gate of transistor M9.

As a result, when the signal LEAKSEN is high indicating a leakage sampling phase, transistors M2 and M7 are off, while transistors M9 and M10 are on. Conversely, when LEAKSEN is low indicating a sensing phase, transistors M2 and M7 are on, while transistors M9 and M10 are off.

The data line load circuit includes a first branch including transistor M3 and M9 which is enabled during the first phase used for sampling the leakage current.

The data line load circuit includes a second branch including resistor R1 and transistor M2 which is enabled during the second phase, used for sensing current from the selected cell.

In the first branch, the transistors M3 and M9 are connected in series between the data line 201 and a supply voltage. Transistor M3 in this example has its gate connected to its drain, in a diode configuration and acts as a reference cell in a first leg of a current mirror circuit through which the current generated during the leakage bias arrangement on the data line is directed during this first phase.

A circuit to sample the leakage current includes transistors M4 and M5 configured as an output leg of the current mirror circuit. The gate of transistor M4 is connected to the gate of transistor M3. The source of transistor M4 is connected to the supply voltage. Transistor M5 has its gate and drain connected in a diode configuration, and to the drain of transistor M4. The source of transistor M5 is connected to ground. As a result of this current mirror configuration, a leak sample current through transistor M4 is a function of the current through transistor M3 and the ratio of the sizes of the transistors. Thus, the relative magnitude of the leak sample current through transistor M4 can be precisely tuned by configuration of the circuit.

During the leakage sampling phase, transistor M10 (configured as a switch) is on, connecting the gate of transistor M5 to a first terminal of capacitor C1. A second terminal of the capacitor C1 is connected to ground.

LEAKSEN is high for a time interval corresponding to the first phase of the read operation. During this time interval, the capacitor C1 will charge up to the voltage at the gate of transistor M5.

Because transistor M7 is off while LEAKSEN is high, no current flows in transistor M6.

Thus, the switch transistor M10 and the capacitor C1 are configured as a sample and hold circuit which samples the voltage indicating the magnitude of the leakage current, and holds the value until the sensing phase of the read operation.

During a second phase of the read operation, LEAKSEN is low. When LEAKSEN is low, the transistor M2 in the second branch of the data line load circuit is on, while the transistor M9 in the first branch is off. This isolates the leak sampling circuit from the data line 201, during the sensing phase.

The circuit shown in FIG. 3 includes a controllable reference current source that comprises transistors M6, M7 and M8 and resistor R2. In this example, the transistor M8 is connected between the line SA2 connected to the "−" input of the comparator 202 and ground. A voltage reference VREF is connected to the gate of transistor M8. VREF can be produced using a regulated voltage source or otherwise so that a constant reference current is generated in transistor M8 when the load circuit is on. A reference load circuit including transistor M7 and resistor R2 is connected between the line SA2 and the supply voltage.

Also, in this example, transistor M6 is connected between the line SA2 and ground. The gate of transistor M6 is connected to the capacitor C1. When LEAKSEN is low, this terminal of the capacitor C1 is isolated from transistor M5. As a result, when the load circuit is on, a current is generated through transistor M6 which is a function of the voltage on capacitor C1, which in turn is a measure of the leakage current sensed during the first phase of the read operation.

In the circuit shown, the leakage current generated during the first phase, when the array is biased in a leakage sampling arrangement for the selected memory cell, is conducted through transistors M3 and M4. A sample current is conducted through transistors M4 and M5. The relative magnitude of the sample current to the leakage current can be tuned using the sizing of the transistors M4 and M3, for example. Likewise, the voltage on the capacitor C1 corresponds to the voltage on the gate of transistor M5, in the condition in which M5 is conducting the sample current. The voltage on the capacitor C1 is applied to the gate of transistor M6 to produce the compensation current. As a result, the relative magnitude of the compensation current conducted by transistor M6 to the sample current can be tuned using sizing of the transistors M5 and M6, among other factors.

Figure 4:
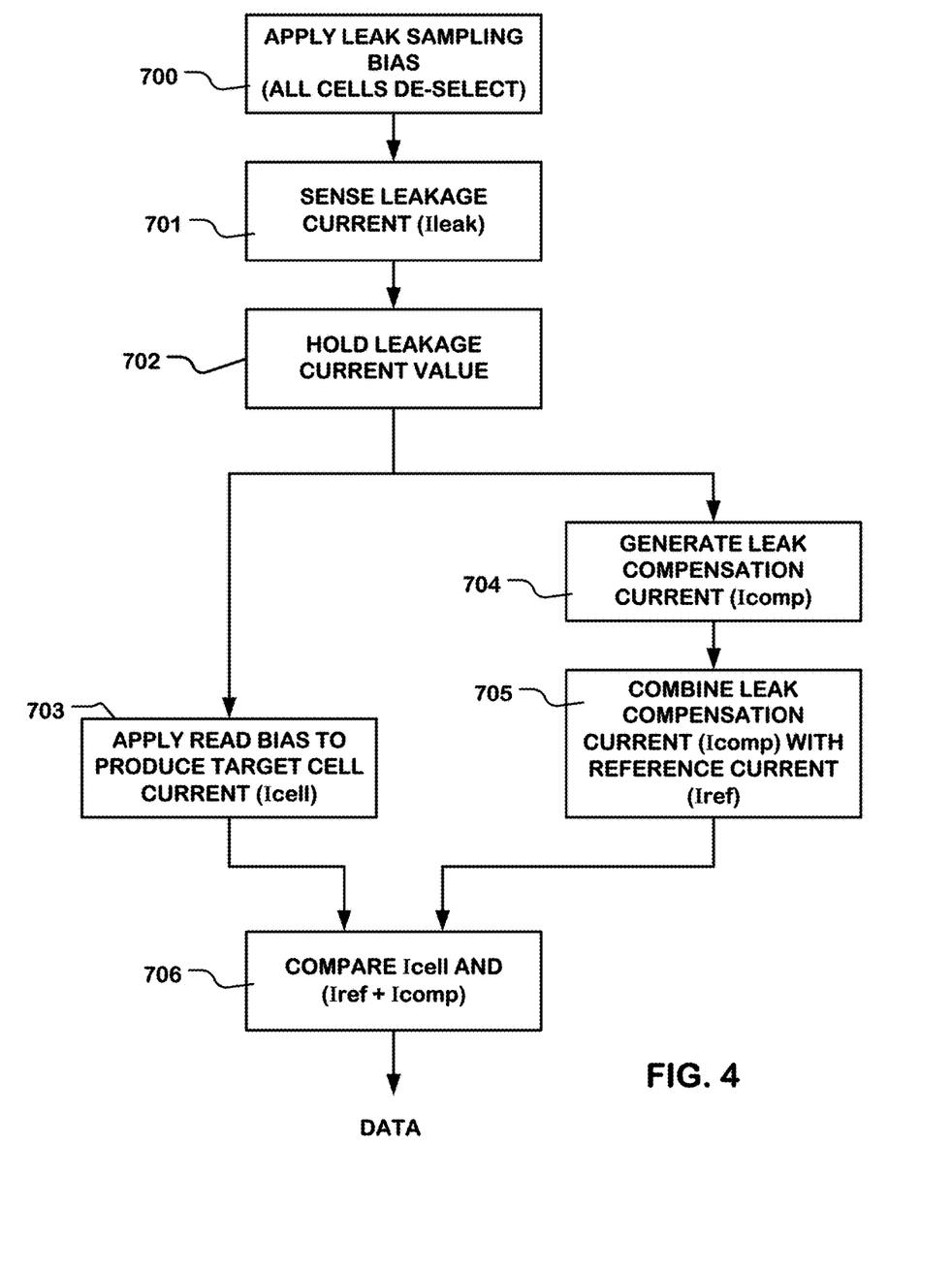
FIG. 4 is a flowchart of a method for compensating for leakage current.

FIG. 4 is a flowchart illustrating functions of a control circuit which cause execution of a read operation having a first phase and a second phase as described above, executed to control the circuit such as shown in FIG. 3.

According to the method shown in FIG. 4, in a first phase of the read operation (when LEAKSEN is high), a leakage sampling bias is applied to the array (700). Also, the leakage current is sensed (701). The sampling circuit holds the leakage current value, in the capacitor C1 in the example of FIG. 3 (702). During a second phase, (when LEAKSEN is low), the controllable current source is enabled to generate a leak compensation current Icomp (704) and to combine the leak compensation current Icomp with a reference current Iref (705). Also, a read bias is applied to the array to produce current through the target cell (Icell) (703). In order to determine the data values stored in the target cell, the sense amplifier compares the cell current Icell with the combination of Iref and Icomp produced by the controllable reference current generator (706).

Figure 5:
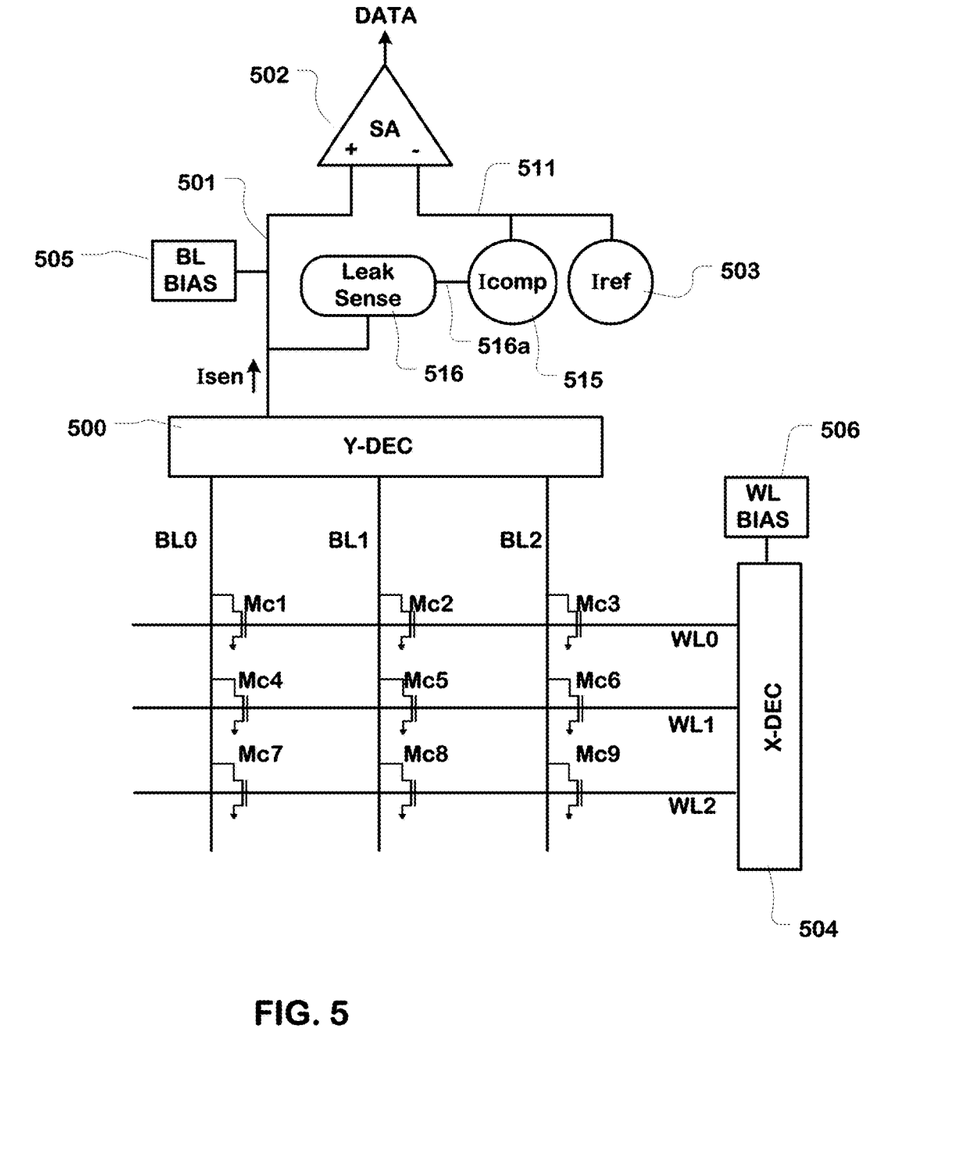
FIG. 5 is a simplified diagram of a NOR architecture memory array, including leakage compensation as described herein.

FIG. 5 illustrates an alternative embodiment including a NOR architecture memory array. The schematic of FIG. 5 is drawn in the style of FIG. 2. The components are implemented in order to support the operation of the memory cells Mc1 to Mc9 in the illustrated portion of the array, and so are given different reference numerals.

Accordingly, the memory array includes a plurality of bit lines, including in the illustrated example, bit lines BL0 to BL2. Likewise, the memory cell array includes a plurality of word lines, including in the illustrated example, word lines WL0 to WL2. Of course, the number of memory cells, bit lines and word lines can be much higher in practical memory devices. The memory cells can comprise for example floating gate memory cells or dielectric charge trapping memory cells in this arrangement.

The memory cells Mc1, Mc4 and Mc7 are coupled to a bit line BL0, and have control gates coupled to the plurality of word lines WL0 to WL2.

The memory cells Mc2, Mc5 and Mc8 are coupled to a bit line BL1, and have control gates coupled to the plurality of word lines WL0 to WL2.

The memory cells Mc3, Mc6 and Mc9 are coupled to a bit line BL2, and have control gates coupled to the plurality of word lines WL0 to WL2.

The bit lines BL0 to BL2 are coupled to a column decoder (Y-DEC) 500 that is configured to connect a selected bit line to a data line 501 in response to decoded addresses (not shown).

The word lines WL0 to WL2 are coupled to a row decoder (X-DEC) 504 that is configured to apply bias voltages to the word lines in response to decoded addresses.

A bit line bias circuit 505 is coupled to the data line 501 in this example, and configured to apply bias voltages under control of a state machine or other controller on the memory device for the various operations, including a read operation.

A word line bias circuit 506 is coupled to the row decoder 504 in this example, and configured to apply bias voltages that are driven on the word lines under control of the state machine or other controller on the memory device for the various operations, including during a read operation.

The sense amplifier 502 has a "+" input connected to the data line 501. The sense amplifier 502 has a "−" input connected to a reference line 511, which in turn is connected to a controllable reference current source, which in this example includes a compensation current source 515 which produces a current Icomp, and a constant reference current source 503 which produces a current Iref.

The combination of the current Icomp and Iref is applied to reference line 511 on the "−" input of the sense amplifier 502, and is produced as a function of leakage current.

A leak sensing circuit 516 is connected to the data line 501 in this example. The leak sensing circuit 516 generates a control signal, which is connected by line 516a to the controllable compensation current source 515. As a result, the controllable current source which is connected to the reference input side of the sense amplifier can produce a reference current that is a function of leakage current on the current path of the selected memory cell.

Control circuitry on the device is configured to cause execution of a read operation, including a leakage sampling phase in which the array is biased to induce leakage current on the selected bit line, and a sensing phase in which the array is biased to read a selected memory cell on the selected bit line.

Leakage current induced as a result of this leakage sampling bias arrangement will be combined and delivered on the data line as Isen during the leakage sampling phase. The leak sensing circuit 516 will sample leakage current, and hold a value for use during the sensing phase of the read operation. This value will be used to provide the control signal to the compensation current source 515 that controls the magnitude of Icomp.

The leak sensing circuit 516 is operable during the first phase to sample leakage current, and provide a control signal during the second phase to the control input of the controllable reference current source as a function of the sample leakage current.

The compensation current Icomp is produced in a manner that is isolated from the data line during the sensing phase of the read operation. This enables more precise control of the compensation current.

Figure 6:
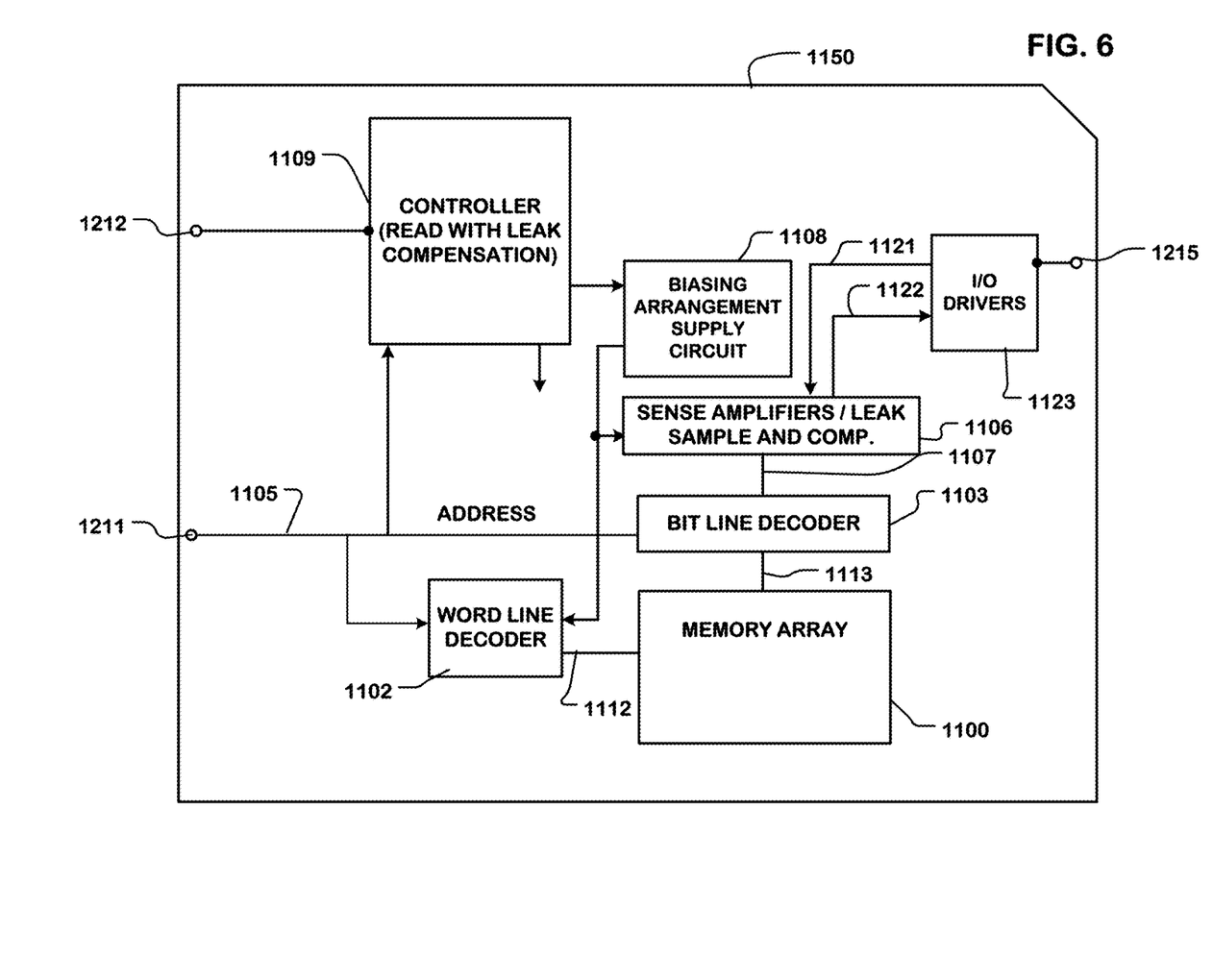
FIG. 6 is a block diagram of an integrated circuit memory device including leakage compensation technology as described herein.

FIG. 6 shows an integrated circuit 1150 including a memory array 1100 comprising memory cells such as programmable resistance memory cells or charge trapping memory cells. The integrated circuit 1150 includes a set of pads 1211, 1212, 1215 in this figure. The pads are structures on the integrated circuit that are configured for connection to external wiring configured to carry signals such as addresses, control signals like chip select signals, clock signals, data signals, and so on.

The memory array includes a plurality of access lines 1112, 1113. In some embodiments, the memory array includes first access lines 1113, such as bit lines, and second access lines 1112, such as word lines or source lines. In some embodiments, in which the second access lines 1112 are source lines, the array may include word lines, in addition, for controlling the switch elements in the memory cells.

A first access line decoder 1103 is coupled to and in electrical communication with the plurality of first access lines 1113, which are arranged as columns in the memory array 1100 for reading data from, and writing data to, the memory cells in the memory array 1100. The first access line decoder 1103 can comprise first access line drivers. A second access line decoder 1102 is coupled to, and in electrical communication with, the plurality of second access lines 1112, which are arranged as rows in the memory array 1100. The second access line decoder 1102 can comprise second access line drivers that apply bias voltages to the second access lines 1112 under control of the controller and of address decoding. Addresses are supplied on bus 1105 to the first access line decoder 1103, and second access line decoder 1102. Sense amplifiers and other supporting circuitry such as pre-charge circuits, and so on, along with data-in structures in block 1106, are coupled to the first access line decoder 1103 via the bus 1107 in this embodiment.

The sense amplifiers in block 1106 include leak sample and hold circuits and can generate a leakage compensation current as described above with reference to FIGS. 2-5.

Data is supplied via the data-in line 1121 from input/output drivers 1123 coupled to pads (1215) on the integrated circuit 1150 or other data sources, to the data-in structures in block 1106. Data is supplied via the data-out line 1122 from the sense amplifiers in block 1106 to input/output drivers 1123 on the integrated circuit 1150, or to other data destinations internal or external to the integrated circuit 1150.

A state machine, or other logic in controller 1109, controls a biasing arrangement supply circuit 1108 to execute memory operations, such as write (set and reset, or program and erase) and read operations. The biasing arrangement supply circuit 1108 can comprise voltage regulators, level shifters or charge pumps to provide bias arrangements with different voltage levels, and deliver the required bias arrangement for the write and read operations to the first access line decoder 1103 and second access line decoder 1102. Also, control circuitry in the controller 1109 coordinates operation of sense circuitry and the data-in structures in block 1106, for read and write operations. The circuitry can be implemented using special purpose logic, a general purpose processor or a combination thereof.

The controller 1109 is configured to execute a read operation in response to command decoding. In a read operation as described herein, the controller 1109 is configured to apply bias voltages to the array including a leak sensing bias arrangement and a read biasing arrangement in response to the first and second phases of the read operation. The controller 1109 includes logic to cause execution of the functions described with reference to FIG. 4, in some embodiments.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   an array of memory cells including bit lines, and biasing circuitry to apply bias arrangements to the array of memory cells;
   a sense amplifier having a data line input connected to a data line, and a reference input;
   a column decoder coupled to bit lines in the array to connect a selected bit line to the data line;
   a data line load circuit connected to the data line;
   a controllable reference current source connected to the reference input, and having a control input;
   control circuits to cause execution of a read operation, including a first phase in which the array is biased to induce leakage current on the selected bit line and a second phase in which the array is biased to read a selected memory cell on the selected bit line; and
   a circuit to sample the leakage current in the first phase, and provide a control signal to the control input of the controllable reference current source during the second phase as a function of the sampled leakage current;
   wherein the circuit to sample the leakage current comprises a current mirror circuit coupled to the data line load circuit which generates a sample current, and a capacitor connected to be charged by the sample current during the first phase, and connected to provide the control signal during the second phase.

2. The device of claim 1, wherein the controllable reference current source includes a reference current load circuit, and the control circuits disable the reference current load circuit during the first phase.

3. The device of claim 1, wherein the data line load circuit includes a first branch enabled during the first phase and a second branch enabled during the second phase; and
   the circuit to sample the leakage current is connected to the second branch.

4. The device of claim 3, wherein:
   the current mirror circuit is coupled to the first branch of the data line load circuit;
   and including
   a switch to connect the capacitor to the sample current during the first phase, and to connect the capacitor to provide the control signal during the second phase.

5. A method for sensing data in a memory array, comprising:
   selecting a memory cell coupled to a selected bit line;
   biasing the memory array to induce leakage current through the memory cells on the selected bit line;
   sampling the leakage current;
   biasing the memory array to induce read current through the selected memory cell on the selected bit line;
   generating a leakage compensation current isolated from the read current in response to the sampled leakage current; and
   sensing the data based on the read current and the compensation current; wherein sampling the leakage current includes enabling a current mirror circuit to generate a sample current as a function of the leakage current on the selected bit line, and generating a measure of the sample current.

6. The method of claim 5, including generating a measure of the sample current by applying the sample current to charge a capacitor to a sample voltage.

7. The method of claim 5, including sampling and holding a voltage generated using a function of the leakage current, and applying the voltage to a controllable current source to generate the compensation current.

8. A memory device, comprising:
   an array of memory cells including bit lines, and biasing circuitry to apply bias arrangements to the array of memory cells;
   a sense amplifier having a data line input connected to a data line, and a reference input;
   a column decoder coupled to bit lines in the array to connect a selected bit line to the data line;
   a data line load circuit connected to the data line;
   a reference current source connected to the reference input;
   a controllable compensation circuit coupled to the sense amplifier, and having a control input;
   control circuits to cause execution of a read operation, including a leakage sampling phase in which the array is biased to induce leakage current on the selected bit line and a sensing phase in which the array is biased to read a selected memory cell on the selected bit line; and
   a current mirror circuit coupled to the data line load circuit which generates a sample current, and a capacitor connected to be charged by the sample current during the leakage sampling phase, and connected to the control input of a controllable compensation current source during the sensing phase.

9. The device of claim 8, wherein the controllable compensation circuit is connected to the reference current source.

10. The device of claim 8, wherein the reference current source includes a reference current load circuit, and the control circuits disable the reference current load circuit during the leakage sampling phase.

11. The device of claim 8, wherein the data line load circuit includes a first branch enabled during the leakage sampling phase and a second branch enabled during the sensing phase; and the current mirror circuit is coupled to the first branch of the data line load circuit; and including:
   a switch to connect the capacitor to the sample current during the leakage sampling phase, and to connect the capacitor to provide a control signal during the sensing phase.

* * * * *